United States Patent [19]

Lenderking

[11] 4,206,368
[45] Jun. 3, 1980

[54] SIGNAL ISOLATING TECHNIQUE

[75] Inventor: Bruce N. Lenderking, Glen Burnie, Md.

[73] Assignee: Westinghouse Electric Corp., Pittsburgh, Pa.

[21] Appl. No.: 882,830

[22] Filed: Mar. 2, 1978

[51] Int. Cl.² .................. H03K 17/78; H03K 39/12
[52] U.S. Cl. ...................... 307/204; 250/551; 250/552; 307/DIG. 1; 307/311
[58] Field of Search ............ 307/311, DIG. 1, 204, 307/244; 250/552, 551

[56] References Cited

U.S. PATENT DOCUMENTS

| | | | |
|---|---|---|---|
| 2,992,263 | 7/1961 | Granqvist | 307/219 |
| 3,069,562 | 12/1962 | Steele | 307/304 |
| 3,201,701 | 8/1965 | Mattra | 307/304 |
| 3,975,643 | 8/1976 | Toth | 307/311 |
| 3,995,173 | 11/1976 | Sibley | 307/311 |

*Primary Examiner*—Stanley D. Miller, Jr.
*Assistant Examiner*—B. P. Davis
*Attorney, Agent, or Firm*—M. P. Lynch

[57] ABSTRACT

In a system wherein a single input signal is transmitted via a plurality of output signal channels for various signal processing and control functions, optical isolating circuits in combination with current limiting resistors provide operational isolation among the respective output signal transmitting channels such that a component failure in one channel will not adversely affect the operation of the remaining channels.

4 Claims, 2 Drawing Figures

SIGNAL ISOLATING TECHNIQUE

BACKGROUND OF THE INVENTION

In digital systems there are numerous requirements for processing a single contact closure or logic signal via a plurality of signal processing channels to effect various data processing and control functions. In such systems, wherein a single input is supplied simultaneously to a pluraltiy of signal channels, there exists the essential requirement to isolate the respective signal processing channels to assure the operational integrity of the channels in the event of a component failure in one of the signal channels.

SUMMARY OF THE INVENTION

There is described herein with reference to the accompanying drawings a multiple signal channel output scheme for transmitting a single logic input signal for subsequent processing and control functions via output signal channels wherein each output signal channel includes an optical isolator circuit in combination with current limiting resistors and electrical potential means which function to prevent the effects of component failures of one signal output channel from adversely affecting the operation of the remaining signal output channels.

BRIEF DESCRIPTION OF THE DRAWINGS

The invention will become more readily apparent from the following exemplary description in connection with the accompanying drawings.

DESCRIPTION OF THE PREFERRED EMBODIMENT

Figure 1:
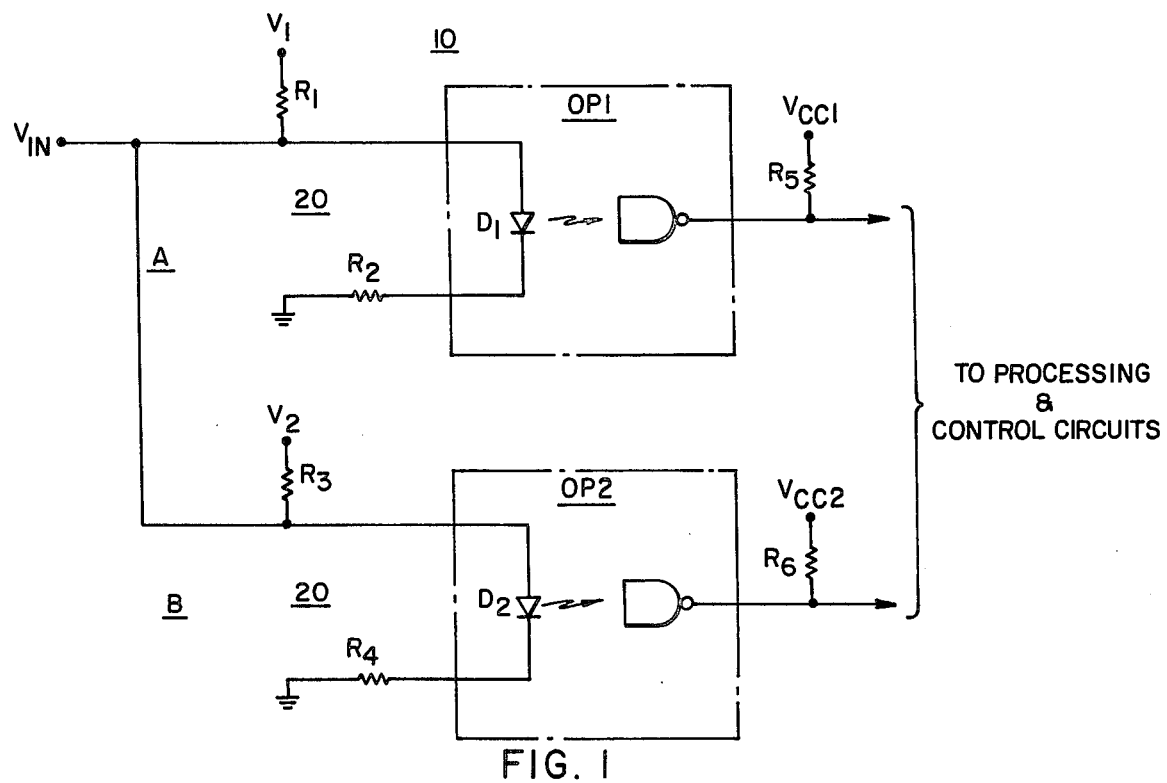
FIG. 1 is an electrical schematic illustration of an embodiment of the invention.

Referring to FIG. 1, there is schematically illustrated a digital circuit 10 consisting of a plurality of signal output channels 20 which respond to a common logic input signal $V_{IN}$ by transmitting the logic input signal as an output signal to individual signal processing and control circuits (not shown). Inasmuch as the structure and function of the respective output signal channels 20 are identical, the following discussion with respect to two of the channels 20 to effect desired signal transmission and channel-to-channel isolation will apply equally to any additional channels employed.

For the purpose of the following discussion, the pair of identical channels 20 illustrated in FIG. 1 will be designated channels A and B with channel A including optical isolating circuit OP1 including a light emitting diode $D_1$ and a collector potential supply source $V_{CC1}$, a DC potential supply $V_1$ and current limiting resistors $R_1$ and $R_2$. Similarly, channel B consists of optical isolating circuit OP2 having a light emitting diode $D_2$ and a collector potential supply source $V_{CC2}$, a DC potential source $V_2$ and current limiting resistors $R_3$ and $R_4$. The optical isolating circuits OP1 and OP2 can be implemented with commercially available circuits such as the Hewlett Packard Model 5082-4360. In the respective output signal channel implementations resistors $R_1$ and $R_3$ function to isolate DC power sources $V_1$ and $V_2$ from damaging current surges generated as a result of component failure in the respective signal output channels A and B. Resistors $R_2$ and $R_4$ function as current limiting resistors to assure the continued operation of the respective optical isolating circuit in the event of a component failure in any of the signal output channels connected to accept the logic input signal $V_{IN}$.

The emitting diode $D_1$ of channel A is energized by a current passing through resistors $R_1$ and $R_2$ in response to the applied excitation potential of voltage source $V_1$. In the embodiment disclosed herein and described hereafter, the emitting diode $D_1$ is in an emitting mode when the logic input signal $V_{IN}$ is high, i.e., not a sinking current, and is in a non-emitting mode when the logic input signal $V_{IN}$ is low, i.e., sinking current. Similarly, emitting diode $D_2$ of channel B is energized by a current passing through resistors $R_3$ and $R_4$ in response to the applied excitation potential of potential source $V_2$. The value of resistor $R_4$ of channel B is selected such that the optical isolating circuit OP2 will not change state as a result of a component failure in channel A. Similarly, the resistance value of resistor $R_2$ of channel A is selected to assure continued operation of optical isolating circuit OP1 in the event of a component failure in channel B. Furthermore, the resistance value of resistors $R_2$ and $R_4$ are selected to prevent excessive current flow through the emitting diodes $D_1$ and $D_2$ respectively in the event of a short in resistors $R_1$ or $R_3$. Thus the circuit configurations of channels A and B of FIG. 1 prevent the malfunction of a component in any channel from adversely affecting the continued operation of the optical isolating circuit of another channel. In order to assure proper isolation among the respective channels, separate excitation power sources, i.e., $V_1$, $V_2$, etc., should be employed.

Figure 2:
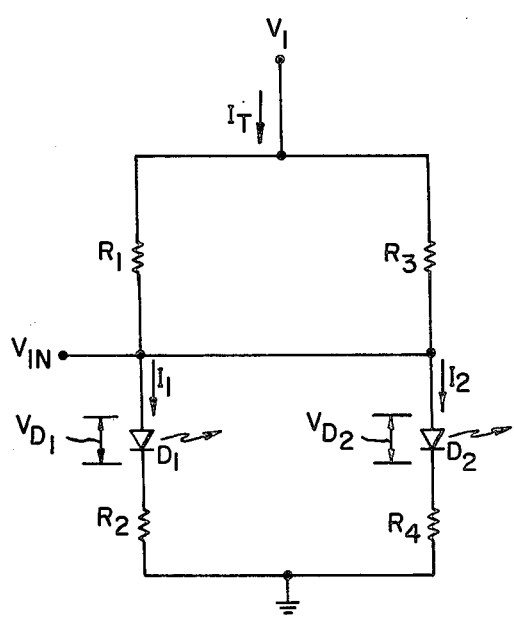
FIG. 2 is a schematic illustration of the equivalent circuit of the schematic illustration of FIG. 1.

The following analysis of the operation of the schematic embodiment of FIG. 1 as it relates to the equivalent circuit of FIG. 2, illustrates the circuit operation in both normal modes and failed modes. In the following calculations the logic input signal $V_{IN}$ corresponds to either opened or closed contacts, $V_1 = +5$ vdc, $I_T$ represents total current represented by $I_1 + I_2$, and $V_{D1}$ and $V_{D2}$ represents the voltage developed across the emitting diodes $D_1$ and $D_2$ respectively and is assumed to be 1.5 vdc.

$$I_T \left( \frac{R_1 R_3}{R_1 + R_3} \right) + V_{D1} + I_1 R_2 - 5 = 0 \qquad 1$$

$$I_T \left( \frac{R_1 R_3}{R_1 + R_3} \right) + V_{D2} + I_2 R_4 - 5 = 0 \qquad 2$$

since 1 = 2
$$+ V_{D1} + I_1 R_2 = V_{D2} + I_2 R_4 \qquad 3$$
for a balanced equation
$V_{D1} = V_{D2}$; $R_2 = R_4$
then $I_1 = I_2$
$$I_T = I_1 + I_2 = 2I_1 = 2I_2 \qquad 4$$
Substituting 4 into 1

$$2I_1 \left( \frac{R_1 R_3}{R_1 + R_3} \right) + V_{D1} + I_1 R_2 - 5 = 0$$

The value of resistor $R_2$ is selected to limit total current $I_T$ to a maximum value, $I_{max}$, in the event resistor $R_1$ or resistor $R_3$ is short circuited. This maximum current is 10 ma for the Hewlett Packard Model 5082-4360 optical isolator.

The value of resistor $R_1$ is selected to limit the current to maximize reliability which typically corresponds to $I_1 = \frac{1}{2} I_{max}$.

Under the above conditions, a practical value for resistor $R_1$, $R_2$, $R_3$ and $R_4$ is approximately 350 ohms. Thus, with $V_{IN}$ corresponding to contact open the emitting diodes $D_1$ and $D_2$ of optical isolating circuits OP1 and OP2 are in an ON state and isolated channels A and B are at a logic 0 state. If $V_{IN}$ corresponds to contact closed, $V_{IN}=0$, and the emitting diodes $D_1$ and $D_2$ of optical isolating circuits OP1 and OP2 are in an OFF state and channels A and B are at a logic 1 state.

Consider the failed condition of a shorted diode $D_2$ where $V_{D2}=0$.

In the event of a shorted diode $D_2$ wherein $V_{D2}=0$, and the potential of source $V_{CC2}$ is much greater than the circuit requires, current $I_2$ would increase but $I_1$ would remain essentially unchanged.

If diode $V_{D2}$ is open, then $I_T=I_1$ and $$I_1 = \frac{V_{CC2} - V_{D1}}{\frac{R_1 R_2}{R_1 + R_2} + R_2}$$

and channel A will function normally.

Assuming resistor $R_3$ is open, $$I_T R_1 + V_{D1} + I_1 R_2 - V_{CC2} = 0.$$

Since $I_1=I_2$ then $I_T=2I_1$ and $I_1$ is of a level less than the maximum current level of 10 ma such that channel A of circuit 10 functions normally.

In the event resistor $R_2$ or resistor $R_4$ is open, the results would correspond to that of an open emitting diode as described above.

Assuming resistor $R_1$ or resistor $R_3$ is shorted, both current $I_1$ and $I_2$ increase to a maximum current, $I_{max}$, of 10 ma and the optical isolating circuits OP1 and OP2 will function normally but at reduced reliability.

Thus, a failed condition for any of the optical isolating circuits or associated components assures either normal operation for all channels, or normal operation of all but one channel.

What is claimed is:

1. Apparatus for transmitting a logic signal through a plurality of signal channels, comprising,
   a plurality of signal channels,
   input circuit means for applying a digital signal to said plurality of signal channels, each of said signal channels including:
   (a) an optical isolating circuit including a light emitting diode having an input and an output, said input corresponding to the input of said optical isolating circuit and having an electrical input lead connected thereto, the electrical input leads of the respective signal channels being connected in common to said input circuit means,
   (b) an electrical excitation means and a first electrical impedance means connecting said electrical excitation means to said electrical input lead,
   (c) a second electrical impedance means connecting the output of the light emitting diode to an electrical ground,
   the value of said first electrical impedance means being such as to isolate said electrical means from damaging current surges resulting from a component failure in said signal channel,
   the value of said second electrical impedance means being such as to insure the continued operation of its corresponding optical isolating circuit means in the event of a component failure in any of the other signal channels connected to said input circuit means.

2. Apparatus as claimed in claim 1 wherein separate electrical excitation means are employed for each of the respective signal channels.

3. Apparatus as claimed in claim 1 wherein said first and second electrical impedance means are resistors.

4. Apparatus as claimed in claim 1 wherein the first electrical impedance means of each signal channel are resistors of identical value, and said second impedance means of each of said signal channels are resistors of identical value.

* * * * *